United States Patent
Chaleix et al.

(10) Patent No.: US 10,619,250 B2
(45) Date of Patent: Apr. 14, 2020

(54) MULTI-LAYER SUBSTRATE

(71) Applicant: ArcelorMittal, Luxembourg (LU)

(72) Inventors: Daniel Chaleix, Verny (FR); Eric Silberberg, Haltinne (BE); Bruno Schmitz, Nandrin (BE); Xavier Vanden Eynde, Latinne (BE); Sergio Pace, Jodoigne (BE)

(73) Assignee: ArcelorMittal, Luxembourg (LU)

( * ) Notice: Subject to any disclaimer, the term of this patent is extended or adjusted under 35 U.S.C. 154(b) by 503 days.

(21) Appl. No.: 15/301,821

(22) PCT Filed: Apr. 4, 2014

(86) PCT No.: PCT/IB2014/000485
§ 371 (c)(1),
(2) Date: Oct. 4, 2016

(87) PCT Pub. No.: WO2015/150850
PCT Pub. Date: Oct. 8, 2015

(65) Prior Publication Data
US 2017/0114467 A1 Apr. 27, 2017

(51) Int. Cl.
*C23C 28/00* (2006.01)
*C23C 14/02* (2006.01)
(Continued)

(52) U.S. Cl.
CPC ............ *C23C 28/3225* (2013.01); *B32B 7/12* (2013.01); *B32B 15/00* (2013.01); *B32B 15/011* (2013.01);
(Continued)

(58) Field of Classification Search
CPC .. C25D 5/36; C25D 5/14; B32B 15/00; B32B 15/18; B32B 15/013; B32B 15/011;
(Continued)

(56) References Cited

U.S. PATENT DOCUMENTS 4,994,435 A * 2/1991 Shiga .................... H01L 39/126
204/192.24
5,846,605 A * 12/1998 Rickerby ................ C23C 10/48
427/570

(Continued)

FOREIGN PATENT DOCUMENTS

CN 1433486 A 7/2003
EP 0459865 A1 12/1991
(Continued)

OTHER PUBLICATIONS

Specification Sheet: Alloy 310/310S/310H, downloaded from https://www.sandmeyersteel.com/images/310-spec-sheet.pdf (two pages) (no date), Nov. 6, 2018.*

(Continued)

*Primary Examiner* — Michael E. La Villa
(74) *Attorney, Agent, or Firm* — Davidson, Davidson & Kappel, LLC (57) ABSTRACT

Substrate provided with a plurality of layers, at least one of which includes metal oxides and is topped directly by a metal coating layer that contains at least 8% by weight nickel and at least 10% by weight chromium, the remainder being iron, additional elements and the impurities resulting from the fabrication process, wherein this metal coating layer is topped directly by an anticorrosion coating layer. A corresponding fabrication method is also provided.

15 Claims, 2 Drawing Sheets

(51) Int. Cl.
| | |
|---|---|
| *C23C 14/16* | (2006.01) |
| *C23C 14/35* | (2006.01) |
| *B32B 15/18* | (2006.01) |
| *B32B 15/01* | (2006.01) |
| *C22C 38/28* | (2006.01) |
| *C22C 38/44* | (2006.01) |
| *C22C 38/04* | (2006.01) |
| *C22C 38/02* | (2006.01) |
| *C22C 38/00* | (2006.01) |
| *C25D 5/36* | (2006.01) |
| *B32B 15/00* | (2006.01) |
| *B32B 7/12* | (2006.01) |
| *C22C 38/58* | (2006.01) |
| *C22C 21/02* | (2006.01) |
| *C25D 5/14* | (2006.01) |
| *B32B 15/04* | (2006.01) |
| *C23C 14/34* | (2006.01) |
| *C23C 30/00* | (2006.01) |
| *B32B 15/20* | (2006.01) |
| *C22C 38/40* | (2006.01) |

(52) U.S. Cl.
CPC .......... *B32B 15/013* (2013.01); *B32B 15/015* (2013.01); *B32B 15/04* (2013.01); *B32B 15/043* (2013.01); *B32B 15/18* (2013.01); *B32B 15/20* (2013.01); *C22C 21/02* (2013.01); *C22C 38/00* (2013.01); *C22C 38/002* (2013.01); *C22C 38/02* (2013.01); *C22C 38/04* (2013.01); *C22C 38/28* (2013.01); *C22C 38/40* (2013.01); *C22C 38/44* (2013.01); *C22C 38/58* (2013.01); *C23C 14/025* (2013.01); *C23C 14/16* (2013.01); *C23C 14/165* (2013.01); *C23C 14/34* (2013.01); *C23C 14/35* (2013.01); *C23C 28/30* (2013.01); *C23C 28/32* (2013.01); *C23C 28/321* (2013.01); *C23C 28/322* (2013.01); *C23C 28/3215* (2013.01); *C23C 28/345* (2013.01); *C23C 28/3455* (2013.01); *C23C 28/42* (2013.01); *C23C 30/00* (2013.01); *C23C 30/005* (2013.01); *C25D 5/14* (2013.01); *C25D 5/36* (2013.01); *B32B 2255/06* (2013.01); *B32B 2255/205* (2013.01); *B32B 2307/714* (2013.01); *B32B 2307/732* (2013.01); *Y10T 428/1259* (2015.01); *Y10T 428/1275* (2015.01); *Y10T 428/12597* (2015.01); *Y10T 428/12604* (2015.01); *Y10T 428/12611* (2015.01); *Y10T 428/12618* (2015.01); *Y10T 428/12729* (2015.01); *Y10T 428/12757* (2015.01); *Y10T 428/12771* (2015.01); *Y10T 428/12792* (2015.01); *Y10T 428/12806* (2015.01); *Y10T 428/12854* (2015.01); *Y10T 428/12917* (2015.01); *Y10T 428/12924* (2015.01); *Y10T 428/12944* (2015.01); *Y10T 428/12951* (2015.01); *Y10T 428/12958* (2015.01); *Y10T 428/12965* (2015.01); *Y10T 428/12972* (2015.01); *Y10T 428/12979* (2015.01); *Y10T 428/2495* (2015.01); *Y10T 428/24967* (2015.01); *Y10T 428/263* (2015.01); *Y10T 428/264* (2015.01); *Y10T 428/265* (2015.01)

(58) Field of Classification Search
CPC ..... B32B 15/04; B32B 15/043; B32B 15/015; B32B 15/20; B32B 2307/732; B32B 2307/714; B32B 7/12; B32B 2255/06; B32B 2255/205; C23C 14/165; C23C 14/025; C23C 14/35; C23C 28/321; C23C 28/3215; C23C 28/322; C23C 28/3225; C23C 28/345; C23C 28/3455; C23C 28/42; C23C 28/30; C23C 28/32; C23C 30/00; C23C 30/005; C23C 14/16; C23C 14/34; C22C 38/00; C22C 38/28; C22C 38/04; C22C 38/02; C22C 38/002; C22C 38/44; C22C 38/58; C22C 38/40; C22C 21/02; Y10T 428/1259; Y10T 428/12597; Y10T 428/12604; Y10T 428/12611; Y10T 428/12618; Y10T 428/263; Y10T 428/264; Y10T 428/265; Y10T 428/1275; Y10T 428/12757; Y10T 428/12792; Y10T 428/12854; Y10T 428/12917; Y10T 428/12924; Y10T 428/12944; Y10T 428/12951; Y10T 428/12958; Y10T 428/12965; Y10T 428/12972; Y10T 428/12979; Y10T 428/12771; Y10T 428/12729; Y10T 428/12806; Y10T 428/2495; Y10T 428/24967
See application file for complete search history.

(56) References Cited

U.S. PATENT DOCUMENTS

| | | | |
|---|---|---|---|
| 6,355,356 B1 | 3/2002 | Hasz | |
| 6,585,864 B1 | 7/2003 | Fisher et al. | |
| 6,663,984 B2 | 12/2003 | Vostrikov et al. | |
| 7,632,592 B2 | 12/2009 | Vyas et al. | |
| 2010/0119866 A1* | 5/2010 | Perepezko | B32B 15/012 428/621 |
| 2013/0171471 A1 | 7/2013 | Bullard et al. | |

FOREIGN PATENT DOCUMENTS

| | | |
|---|---|---|
| EP | 0780486 A1 | 6/1997 |
| EP | 0947606 A1 | 10/1999 |
| EP | 2644737 A1 | 10/2013 |
| JP | S62296304 A | 12/1987 |
| JP | H02130141 A | 5/1990 |
| JP | 2001192862 A | 7/2001 |
| JP | 2008518110 A | 5/2008 |
| KR | 100286661 B1 | 1/2001 |
| RU | 2139793 C1 | 10/1999 |
| RU | 2155134 C1 | 8/2000 |
| RU | 2206631 C2 | 6/2003 |
| RU | 2228387 C2 | 5/2004 |

OTHER PUBLICATIONS

Alloy 316/316L Specifications: UNS S31600/S31603, two pages, no date, downloaded from http://www.pennstainless.com/wp-content/uploads/2013/04/DS-Alloy-316-316L.pdf, Apr. 26, 2019.*
Patten et al., Abstract for Patten et al., "Sputter-deposited multilayered ceramic/metal coatings," Thin Solid Films, vol. 64 (2), 1979, pp. 337-343. (Year: 1979).*
J. W. Patten, et al., "Sputter-Deposited Multilayered Ceramic/Metal Coatings," in Thin Solid Films, 64 (1979) pp. 337-343. (Year: 1979).*

* cited by examiner

| | |
|---|---|
| 38 | Anti-corrosion metal coating 2 |
| 37 | Fe-Cr-Ni |
| 36 | Oxides |
| 34 | Anti-corrosion metal coating 1 |
| 33 | Fe-Cr-Ni |
| 32 | Oxides |
| 31 | Steel |

MULTI-LAYER SUBSTRATE

This invention relates to a multi-layer substrate and a method for the fabrication thereof.

BACKGROUND

Steel sheets are generally covered with a metal coating, the composition of which varies as a function of the final use of the steel sheet. This coating can, for example, be zinc, aluminum, magnesium or their alloys, can include one or more layers and can be applied using different coating technologies known to a person skilled in the art, such as, for example, vacuum deposition methods, hot-dip coating or electro-deposition. In the remainder of this description, the term "metal coating" will also be used to designate a coating that includes metal as well as a coating that includes metal alloy.

The metal coating can first of all be applied by hot-dip coating, whereby this process generally comprises the following steps:
Annealing of the steel sheet as it passes through a furnace under an inert or reducing atmosphere to limit the oxidation of the surface of the sheet;
Dip-coating of the sheet as it passes through a bath of metal or metal alloy in the liquid state so that when it exits the bath, the sheet is coated with the metal/metal alloy.
After the sheet exits the liquid bath, the layer of metal/metal alloy is dried by spraying a gas on the surface to guarantee a uniform and regular thickness of this layer.

During the annealing step, before the steel sheet enters the metal bath (in the following portion of the text the terms "metal bath" and "metal layer" are also used to designate any metal alloy bath and the corresponding metal alloy layers) the sheet is generally heated in a direct flame or radiant tube annealing furnace. However, in spite of numerous measures that are taken, such as the control of an inert atmosphere, the use of these furnaces to heat the steel sheet can lead to the formation of metal oxides on the surface, which must then be removed to ensure the proper wettability of the liquid metal on the surface of the steel sheet and to prevent the occurrence of uncoated areas on the surface of the sheet.

This problem is encountered in particular when the composition of the steel includes significant quantities of easily oxidized elements such as Si, Mn, Al, Cr, B, P etc. For example, an IF (Interstitial-Free) steel that contains 0.2% by weight Mn, 0.02% by weight Si and 5 ppm B is already subject to these problems of wettability as a result of the presence of B which rapidly diffuses to the surface of the sheet and precipitates the oxides of Mn and Si in the form of continuous films, leading to poor wetting.

More generally, the risk of poor wetting by the liquid metal is also encountered in all high-strength steels because they contain at least one of these easily oxidized elements, such as Dual Phase steels, TRIP (Transformation Induced Plasticity) steels, TWIP (TWinning-Induced Plasticity), electrical steels, etc.

For Dual Phase steels, the quantity of Mn is generally less than 3% by weight, with the addition of Cr, Si or Al in quantities generally less than 1% by weight. For TRIP steels, the quantity of Mn is generally less than 2% by weight associated with a maximum of 2% by weight of Si or Al. For TWIP steels, the quantity of Mn can be up to 25% by weight, combined with Al or Si (maximum 3% by weight).

The metal coating can also be applied by electro-deposition. In this method, the steel sheet to be coated is immersed in an electrolyte bath in which one or more soluble anodes are also immersed, the anodes include the metal or the metal alloy corresponding to the coating to be applied to the surface of the sheet. The application of an electric current to the electrolyte bath causes the dissolution of the metal or the metal alloy of which the anode or anodes are made and the ions thereby formed are deposited on the surface of the steel sheet to form a layer of metal or metal alloy coating. Prior to entering the electrolysis bath, the steel sheets must undergo a pickling step to remove the metal oxides that are present on the surface. In fact, for the electrolysis process to be effective, the medium must necessarily be a conductor, which is not the case if metal oxides are present on the surface of the steel sheet to be coated. Moreover, the presence of metal oxides can influence the germination and growth of the deposit and thus lead to problems of adherence and quality of the coating (microstructure, density etc.).

The metal coating can also be applied by vacuum deposition. The vacuum deposition techniques principally require three components:
A source, which constitutes or contains the material to be deposited. This source can be, for example, the crucible of a vacuum evaporator or a sputtering target. The material to be deposited must leave this source in the form of ions, atoms or groups of atoms or groups of molecules;
A substrate, which corresponds to the part to be coated. The material originating from the source is affixed to the substrate to form germs (nucleation), which gradually develop (growth) and result in a more or less ordered coating layer;
A medium, which separates the source from the substrate and which is the location of the phenomenon of transfer of material in the vapor phase.

A distinction is made among different types of vacuum deposits as a function of, among other things, the means used to form the vapor phase. If the vapor phase results from a chemical reaction or the decomposition of a molecule, the process is called CVD, or chemical vapor deposition. On the other hand, if this vapor is produced by a purely physical phenomenon such as thermal evaporation or ion sputtering, the process is a physical vapor deposition or PVD. PVD deposition processes include sputtering, ion implantation and vacuum evaporation.

However, regardless of the vacuum deposition technique used, it requires a preparation of the surface so that the surface of the steel sheet to be coated is free of metal oxides to guarantee the proper adherence of the metal coating and to thereby prevent problems of delamination of the coating.

Regardless of the coating method used, the surface condition of the steel strip before coating is an important factor in the quality of the final coating. The presence of metal oxides on the surface of the steel sheet to be coated prevents the proper adherence of the coating to be applied and can result in zones in which there is no coating on the final product or problems related to the delamination of the coating. These metal oxides can be present in the form of a continuous film on the surface of the steel sheet or in the form of discontinuous points. The metal oxides can also be formed during different steps of the process and their composition varies as a function of the grade of steel of which the sheet in question is made. Oxides of this type include, for example, the iron oxides FeO, $Fe_2O_3$, aluminum oxide $Al_2O_3$ as well as $MnSiO_x$ or $AlSiO_x$.

The removal of these metal oxides requires the execution of an additional process step, i.e. pickling. In the remainder of this description, pickling means any method that results in the removal of the metal oxides formed by oxidation of the underlying metal layer so that this metal layer appears on the surface, in comparison with, for example, a brightening method which, although it is a process that removes metal oxides, is intended only to remove the surface layer of metal oxides without exposing the underlying metal layer.

This removal of metal oxides can be accomplished, for example, by vacuum pickling by magnetron pulverization, which is also called etching. This process includes creating a plasma between the strip and an auxiliary electrode in a gas that makes it possible to generate radicals and/or ions. Under normal operating conditions, these ions are accelerated toward the surface of the strip to be pickled and blast away surface atoms, thereby eliminating the metal oxides present on the surface. This method depends to a great extent on the thickness of the layer of metal oxides to be removed and, depending on the composition of these metal oxides, can generate electric arcs. The process is therefore unstable and not very robust. In addition, it sets a severe limitation on the speed of the line to obtain a good result, which poses productivity problems.

It is also possible to pickle the strip by passing it through one or more successive baths of strong acids such as hydrochloric acid or sulfuric acid, selected as a function of the nature of the metal oxides on the surface and held at a temperature of approximately 80-90° C. This process generates large quantities of effluents which require subsequent treatment and is not environmentally friendly.

In addition, this type of pickling poses the problem of controlling the thickness of metal oxides removed to guarantee the proper adherence of the subsequent coating.

Finally, it is possible to remove all or part of the layers of metal oxides by mechanical action, for example by using a shot-blasting process in which the metal oxides are removed, for example, as a result of the multiple impacts of small abrasive particles projected with sufficient kinetic energy. However, this type of process directly impacts the surface of the strip and is also complicated to implement. Moreover, these processes require working in specific conditions, such as an inert or reducing atmosphere, for example, to prevent the re-oxidation of the metal surfaces by contact with air.

SUMMARY OF THE INVENTION

An object of the present invention is therefore to provide a surface treatment method that makes it possible to, among other things, improve the adherence of a subsequent coating on the substrate and one does not require a step to eliminate the oxides present on the surface.

For this purpose, the present invention provides a substrate including a plurality of layers, at least one of which includes metal oxides and is directly topped by a layer of metal coating that contains at least 8% by weight nickel and at least 10% by weight chromium, the rest being iron, additional elements and impurities resulting from the fabrication process, this metal coating layer being itself directly topped by an anti-corrosion coating layer.

This substrate provided with a plurality of layers can also have the following characteristics, considered individually or in combination:

the substrate further comprising a metal sheet, at least one of the surfaces of which has a first layer of oxides, this first layer of oxides being directly topped by the first layer of metal coating that contains at least 8% by weight nickel and at least 10% by weight chromium, the remainder being iron, additional elements and impurities resulting from the fabrication process, this first metal coating layer being directly topped by the first layer of anti-corrosion coating, the first anti-corrosion coating layer being topped by a second layer of oxides directly topped by a second metal coating layer that contains at least 8% by weight nickel and at least 10% by weight chromium, the remainder being iron, additional elements and impurities resulting from the fabrication process, this second metal coating layer being directly topped by a second anti-corrosion coating layer;

the metal coating layer, or layers, consists or consist of stainless steel containing between 10 and 13% by weight nickel, between 16 and 18% by weight chromium, the remainder being iron and potential impurities resulting from the fabrication process;

the metal coating layer, or layers, consists or consist of a layer or layers of stainless steel containing 0.02% by weight carbon, between 16 and 18% by weight chromium, between 10.5 and 13% by weight nickel, between 2 and 2.5% by weight molybdenum, between 0.9 and 1.3% by weight silicon, between 1.8 and 2.2% by weight manganese, the remainder being iron and potential impurities resulting from the fabrication process;

the metal coating layer(s) has/have a thickness between 2 and 15 nm;

the anti-corrosion coating layer, or layers, consists or consist, of a metal selected from among the group comprising zinc, aluminum, copper, magnesium, titanium, nickel, chromium, manganese and their alloys;

the anti-corrosion coating layer, or layers, consists or consist of zinc or a zinc alloy;

the anti-corrosion coating layer, or layers, consists or consist of a plurality of sub-layers of metal coatings;

at least one anti-corrosion layer is located under the layer of oxides and is in direct contact with the layer of oxides;

the substrate further comprising a steel sheet located under the layer of oxides; and/or the steel sheet is a steel that has a strength greater than or equal to 450 MPa.

The present invention provides a method for the fabrication of a substrate provided with a plurality of layers in which the metal coating layer(s) is/are deposited by a process selected from a vacuum deposition process and an electro-deposition process.

This fabrication method may include a deposition process that is a magnetron cathode pulverization process.

The fabrication method may further include depositing the anti-corrosion layer(s) by a process selected from a vacuum deposition process and an electro-deposition process.

The present invention further provides method for the preparation of the surface of a substrate. The method includes at least one layer of metal oxides in which a metal coating containing at least 8% by weight nickel and at least 10% by weight chromium, the rest being iron and the impurities resulting from the fabrication method, is deposited on said layer of oxides without prior pickling of the layer of oxides.

This surface preparation method may further include depositing an anti-corrosion coating on the metal coating.

Other characteristics and advantages of the invention are explained in greater detail below.

BRIEF DESCRIPTION OF THE DRAWINGS

To illustrate the invention, tests have been performed and will be described in the form of non-limiting examples, in particular with reference to the accompanying figures, in which.

DETAILED DESCRIPTION

Figure 1:
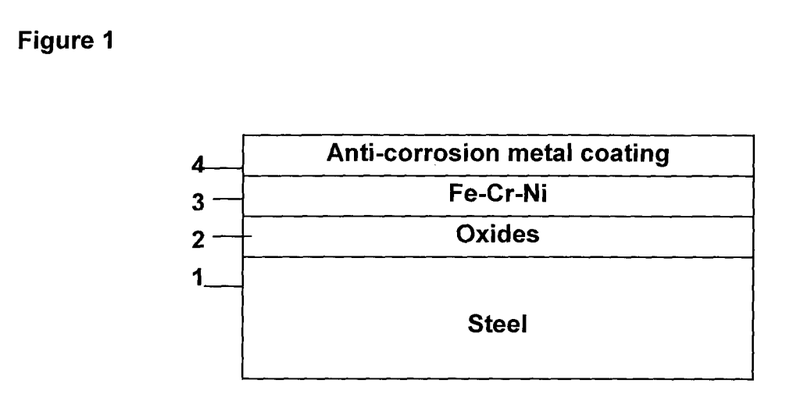
FIG. 1 is a schematic illustration of a substrate in a first embodiment of the invention.
Figure 2:
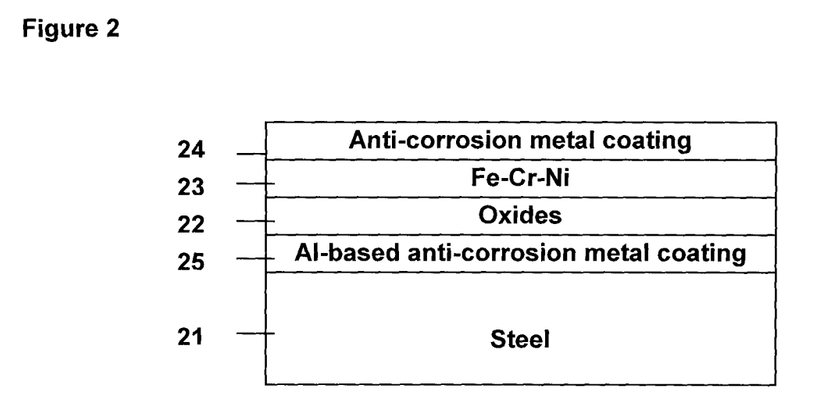
FIG. 2 is a schematic illustration of the substrate in a second embodiment of the invention.
Figure 3:
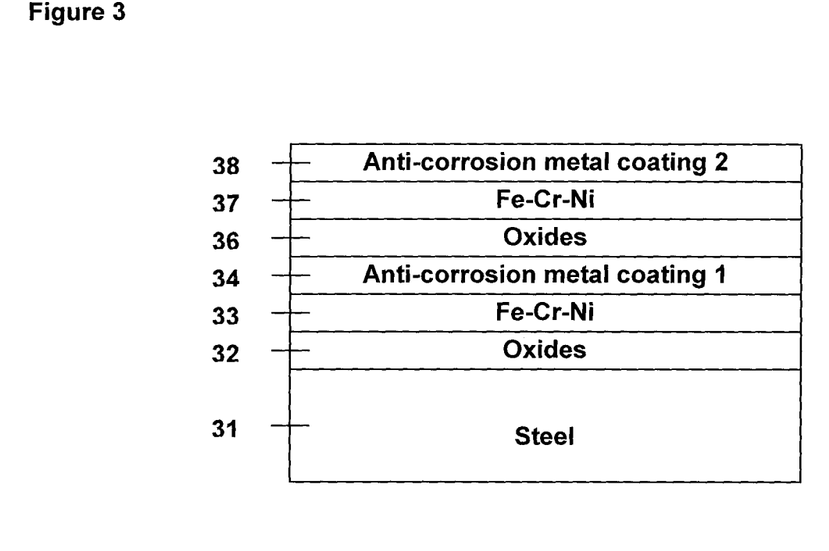
FIG. 3 is a schematic illustration of a substrate in a third embodiment of the invention.

FIGS. 1 to 3 illustrate different embodiments of the invention. The thickness of the layers represented is exclusively for purposes of illustration and cannot be considered to be a representation of the different layers to scale.

For all of the FIGS. 1 to 3, the term "steel" as used here includes all known grades of steel and can be, for example, one of the following grades of THR (Very High Strength, generally between 450 and 900 MPa) or UHR (Ultra High Strength, generally greater than 900 MPa), steel which contain large quantities of oxidizable elements:

Steels without interstitial elements (IF—Interstitial Free), which can contain up to 0.1% by weight Ti;

Dual-phase steels such as DP 500 steels up to DP 1200 steels which can contain up to 3% by weight Mn in association with up to 1% by weight Si, Cr and/or Al, TRIP (TRansformation Induced Plasticity) steels such as TRIP 780, which contains, for example, approximately 1.6% by weight Mn and 1.5% by weight Si;

TRIP or dual-phase steels containing phosphorus;

TWIP (TWinning-Induced Plasticity) steels—steels that have a high content of Mn (generally 17-25% by weight), Low-density steels such as the Fe—Al steels which can contain, for example, up to 10% by weight Al;

Stainless steels, which have a high content of chromium (generally 13-35% by weight), in association with other alloy elements (Si, Mn, Al etc.).

FIG. 1 illustrates a first embodiment of a substrate provided with several layers in accordance with the present invention. This substrate includes a steel sheet 1 that has a layer of oxides 2 on at least one of its surfaces. This layer 2 can be continuous or discontinuous on the steel surface 1 in question and includes metal oxides from the group that includes the iron oxides, chromium oxides, manganese oxides, aluminum oxides, silicon oxides or one or more mixed oxides containing steel alloy elements such as mixed Mn—Si or Al—Si oxides. The thickness of this layer of metal oxides 2 can vary, in general, from 3 to approximately 60 nanometers, for example, and preferably from 3 to approximately 20 nm.

This oxide layer 2 is therefore not removed by pickling and is covered with a layer of a metal coating 3 that contains at least 8% by weight nickel and at least 10% by weight chromium, the remainder including iron, additional elements such as carbon, molybdenum, silicon, manganese, phosphorus or sulfur and the impurities resulting from the fabrication process. This coating 3 can be, for example, stainless steel, and preferably 316 stainless steel (16-18% by weight Cr, 10-14% by weight Ni) its thickness can be, for example, greater than or equal to 2 nm. This metal coating 3 can be applied by any known coating method, and in particular, for example, by magnetron cathodic pulverization or by electro-deposition.

The method for the formation of a coating on a substrate by magnetron cathodic pulverization, which is generally called "sputtering", is carried out in a closed enclosure in which a vacuum has been established and in which are installed a target and a substrate located opposite the target at a certain distance from the latter. The target has a surface layer which is oriented toward the face of the substrate on which a coating is to be formed. This surface layer contains at last one of the elements of which the coating to be deposited on the substrate by sputtering is constituted.

The enclosure contains a plasma of an inert gas such as argon.

In one sputtering method, atoms are ejected from the surface of the surface layer and are deposited in the form of a coating on the substrate. A negative voltage is applied to the target and consequently to the material of the surface layer to be ejected. As a result, a discharge is generated which creates the plasma formed by ions, electrons and inert gas particles. Positively charged ions are accelerated toward the target, which is at a negative potential, so that they reach the target with sufficient energy to cause the ejection of atoms from the surface layer. These detached atoms move toward the substrate and are deposited on the substrate in the form of a reproducible and essentially uniform coating which adheres well to the face of the substrate.

In this first embodiment, the layer 3 of Fe—Ni—Cr metal coating is covered with a layer of anticorrosion metal coating 4. This anticorrosion metal coating layer 4 can include, for example, pure zinc (including the potential impurities resulting from the fabrication process), or zinc alloys such as Zn—Al, Zn—Al—Mg, Zn—Mg, Zn—Fe or Zn—Ni. It can also include aluminum, copper, magnesium, titanium, nickel, chromium, pure manganese (including the potential impurities resulting from the fabrication method), or their alloys, such as Al—Si or Mg—Al, for example. This anti-corrosion metal coating 4 can be applied by any known coating method such as, for example, a sonic vapor jet deposition process, which is also called JVD (Jet Vapor Deposition), an electron gun deposition method or plasma-assisted evaporation, which is also called SIP (Self-Induced Plating) and is described in particular in patent EP0780486.

The JVD method is a vacuum deposition method in which metal vapor is generated by inductively heating a crucible containing a bath of the coating metal in a vacuum enclosure. The steam escapes from the crucible via a conduit that transports it to an exit orifice, which is preferably calibrated, to form a jet at the speed of sound directed at the surface of the substrate to be coated.

FIG. 2 illustrates a second embodiment of the present invention. In this embodiment, the substrate includes as in FIG. 1 a steel sheet 21. This steel sheet 21 is coated with a layer of an aluminum-based anti-corrosion coating 25, such as, for example, an aluminum-silicon coating (10-12% by weight Si). This aluminum-based coating 25 can be deposited by hot dipping, and can have a thickness of between 10 and 30 µm, for example. This aluminum-based coating layer 25 is topped by a layer of metal oxides 22. This layer 22 can be continuous or discontinuous over the surface of the aluminum-based coating 25 in question and can include aluminum oxides and/or mixed aluminum oxides such as Al—Si oxides. The thickness of this layer of metal oxides 22 can in general vary from 3 to approximately 60 nanometers, preferably from 3 to approximately 20 nm.

This layer of oxides 22 is therefore not removed by pickling and is covered by a layer of a metal coating 23 that contains at least 8% by weight nickel and at least 10% by weight chromium, with the remainder including iron, additional elements as disclosed above and the impurities resulting from the fabrication process. This metal coating 23 can be stainless steel, for example, and preferably stainless steel 316 (16-18% by weight Cr, 10-14% weight Ni). This metal coating 23 can be applied by any known coating method and can have a thickness, for example, greater than or equal to 2 nm.

This layer of metal coating 23 in this second embodiment is topped by a layer of anti-corrosion metal coating 24 selected from among the anti-corrosion metal coatings described with reference to the first embodiment. This anti-corrosion metal coating 24 can be applied by any known coating process, such as, for example, a vacuum method or a hot dip method, optionally followed by a post-diffusion treatment.

Coatings that can be considered, for example, include a layer of steel 21 coated by an Al—Si-base coating 25, whereby this coating 25 is topped by a layer of oxides 22 composed of mixed Al—Si oxides, the oxides layer 22 being coated by a layer 23 of stainless steel 316, this layer 23 of stainless steel being coated with a Zn—Mg alloy anti-corrosion coating 24.

FIG. 3 illustrates a third embodiment of the present invention. In this third embodiment, the substrate includes, as in the first embodiment, a steel sheet 31 with a first layer of oxides 32 on at least one of its surfaces. This first layer 32 can be continuous or discontinuous over the surface of the steel 31 and contain metal oxides from the group comprising of, for example, the iron oxides, chromium oxides, manganese oxides, aluminum oxides, silicon oxides or one of the mixed oxides containing the alloy elements of the steel such as mixed Al—Si or Mn—Si oxides. The thickness of this first layer of metal oxides 32 can vary, in general, from 3 to approximately 60 nm, for example, and preferably from 3 to approximately 20 nm.

As in the first embodiment, this layer of oxides 32 is therefore not removed by pickling and is covered by a layer of a metal coating 33 that contains at least 8% by weight nickel and at least 10% by weight chromium, whereby the remainder includes iron, additional elements as disclosed above and the impurities resulting from the fabrication process. This coating 33 can be, for example, stainless steel, and preferably stainless 316 (16-18% by weight Cr, 10-14% by weight Ni). The thickness of this layer of metal coating 33 can, for example, be greater than or equal to 2 nm. This metal coating 33 can be applied by any known coating process, and in particular, for example, by magnetron cathodic pulverization or by electro-deposition. In this embodiment, the layer 33 of Fe—Ni—Cr metal coating is covered by a first layer of anti-corrosion metal coating 34. This first layer of anti-corrosion metal coating 34 can include, for example, pure zinc (containing the potential impurities resulting from the fabrication process), or zinc alloys such as Zn—Al, Zn—Al—Mg, Zn—Mg or Zn—Ni. It can also include aluminum, copper, magnesium, titanium, nickel, chromium, pure manganese (containing the potential impurities resulting from the fabrication process) or their alloys, such as, for example, Al—Si or Mg—Al. This first layer of anti-corrosion metal coating 34 can be applied by any known coating method, such as, for example, a process carried out in a vacuum or a hot-dip process.

In this third embodiment, the first layer of anti-corrosion metal coating 34 is topped by a second layer of metal oxides 36. This layer 36 can be continuous or discontinuous on the surface of the anti-corrosion metallic coating 34 and can include oxides, the composition of which depends on the constituent material of the anti-corrosion metal coating 34. For example, these oxides can be zinc oxides, aluminum oxides or mixed Al—Si, Zn—Mg or Zn—Al oxides. The thickness of this layer of metal oxides 36 can vary, in general, from 3 to approximately 60 nm, for example, and preferably from 3 to approximately 20 nm.

This second layer of oxides 36 is not eliminated by pickling and is covered by a layer of a metal coating 37 that contains at least 8% by weight nickel and at least 10% by weight chromium, with the remainder being iron, additional elements as disclosed above and the impurities resulting from the fabrication process. This coating 37 can, for example, be stainless steel, and preferably stainless steel 316 (16-18% by weight Cr, 10-14% by weight Ni). This metal coating 37 can be applied by any known coating process and can but need not be identical to the metal coating 33. The thickness of this layer of metal coating 37 can, for example, be greater than or equal to 2 nm.

In this third embodiment, this layer of metal coating 37 is topped by a second layer of anti-corrosion metal coating 38 selected from among the anti-corrosion metal coatings described with reference to the first embodiment. This anti-corrosion metal coating 38 can be applied by any known coating method, such as for example a vacuum method or a hot-dip method, optionally followed by a post-diffusion treatment. This anti-corrosion metal coating 38 can but need not be identical to the first anti-corrosion metal coating 34.

For example, consideration can be given to a layer of steel 31, a first layer of iron oxides 32, a first metal coating 33 consisting of stainless steel 316, a first anti-corrosion metal coating 34 consisting of an Al—Si alloy, a second layer of oxides 36 consisting of mixed Al—Si oxides, a second metal coating 37 consisting of stainless steel 316 and the second anti-corrosion metal coating 38 consisting of a Zn—Al—Mg alloy.

The present invention will now be explained on the basis of tests performed for purposes of illustration only and not intended to be limiting.

Tests

Acceptance criteria

T-Bend test

The purpose of this test is to determine the adherence of the coatings by bending the coated sheet at an angle of 180°. The bending radius applied is equal to twice the thickness of the substrate used (which corresponds to a "2T" bend). The adherence of the coating is verified by the application of an adhesive tape. The result of the test is judged positive if the coating remains on the tested sheet and does not appear on the adhesive tape after the tape is removed.

The adhesive tape used for the performance of this test in the tests described below is a commercial adhesive, TESA4104.

Cup Test

This method consists of performing a stamping test during which a cup is formed. This deformation of the material as well as of the metal coating identifies potential problems relating to the adherence of the metal deposit on the substrate. The loss of adherence (or dusting) is expressed in a reduction of the weight of the cup, which is weighed before and after stamping, in $g/m^2$.

Daimler Bending

The first stage of this test consists of applying a punch to the coated steel sheet and measuring the bending angle at which a reduction in strength greater than or equal to 30 kN is observed. This drop in strength corresponds to the cracking of the substrate. The adhesion test of the metal coating then consists of bending the coated sheet at an angle close to but less than this cracking point and checking the adherence of the zinc by the application of an adhesive coating.

The test result is judged positive if the zinc coating remains on the sheet and does not appear on the adhesive tape after the tape is removed.

The adhesive tape used to perform the tests described below has an adhesive strength between 400 and 460 N/m, e.g. Scotch® 3M595.

Tests-1-Adhesion

For all of the tests the composition of the stainless steel 316L used is 0.02% C, 16-18% Cr, 10.5-13% Ni, 2-2.5% Mo, 1% Si, 2% Mn, 0.04% P, 0.03% S. The percentages are percentages by weight, with the remainder being iron and potential impurities resulting from fabrication.

A series of 8 specimens of DP1180 steel sheet of the type sold by ArcelorMittal was prepared. The exact composition of the steel used for the samples is 0.15% C, 1.9% Mn, 0.2% Si, 0.2% Cr, and 0.013% Ti. The percentages are percentages by weight, with the remainder being iron and potential impurities resulting from fabrication.

All of the samples were subjected to the steps described below:

Brightening of the steel sheet by passing it through a bath containing formic acid HCOOH or sulfuric acid $H_2SO_4$ held at a temperature below 50° C. The purpose of this step is to remove the upper layer of iron oxides of type FeO, but it does not remove the underlying layer of oxides.

Rinsing with water.

Drying to remove the water adsorbed during the rinsing step.

Insertion of the strip into a vacuum chamber having a pressure $P<10^{-3}$ mbar.

Vacuum evaporation deposition of a layer of 5 μm of zinc.

Specimens 2 and 6 which are of the type described by the prior art are subjected after this drying step to an etching step to remove the metal oxides that are present on the surface of the steel sheet.

Specimens 1, 5 and 9 in accordance with preferred embodiments of the present invention are then subjected after the step of insertion into the vacuum chamber to a step in which they are coated with a layer of 10 nm of stainless steel 316L by magnetron cathodic pulverization (see description of this method above).

Specimens 4 and 8 are subjected after the insertion into the vacuum chamber to a step in which they are coated with a layer of 10 nm of titanium by magnetron cathodic pulverization (see description of this method above).

Specimen 9 was not subjected to the brightening step.

The characteristics of each specimen are presented in the table below:

| Specimen number | Brightening | Etching | Coating |
|---|---|---|---|
| 1* | H2SO4 | No | Stainless 316 |
| 2 | H2SO4 | Yes | No |
| 3 | H2SO4 | No | No |
| 4 | H2SO4 | No | Ti |
| 5* | HCOOH | No | Stainless 316 |
| 6 | HCOOH | Yes | No |
| 7 | HCOOH | No | No |
| 8 | HCOOH | No | Ti |
| 9* | None | No | Stainless 316 |

*Specimen according to the present invention

All of these specimens were then subjected to the T-bend and cup tests described above.

The results of the "Cup test" are expressed as a percentage of loss of zinc compared to the initial weight of zinc of the cup.

The results are presented in the table below.

| Specimen number | T-bend | Cup test % loss | Conclusion |
|---|---|---|---|
| 1* | OK | 4.5 | OK |
| 2 | OK | 8.4 | OK |
| 3 | NOK | 79.8 | NOK |
| 4 | OK | 42 | NOK |
| 5* | OK | 5.9 | OK |
| 6 | OK | 3.3 | OK |
| 7 | NOK | 67 | NOK |
| 8 | OK | 29 | NOK |
| 9* | OK | 10.5 | OK |

Specimens 2 and 6 as described by the prior art had positive results for both tests. This result is not surprising because these two specimens of the prior art were subjected to an etching step which makes it possible to remove the metal oxides present on the surface and therefore guarantees a good surface condition before coating to obtain a proper adherence of the zinc coating.

For the specimens 1, 5 and 9 according to the present invention, the two tests are conclusive and indicated a good adherence of the zinc, equivalent to that which could be obtained with an etching step, regardless of the acid used for the brightening and even without a prior brightening step (specimen 9).

In addition, specimens 4 and 8 which had a titanium coating instead of the stainless steel 316 coating did not provide any conclusive results in the two tests performed because the adherence of the zinc coating was insufficient.

Tests-2

A series of 12 specimens was prepared with different grades of steel and different process parameters. The set of specimens was manufactured according to the invention and was subjected to the following process steps:

Alkaline degreasing to eliminate potential organic residues present on the surface of the steel sheet. This degreasing was performed by dipping the strip in a bath of a basic solution held at 60° C. The dip time as well as the characteristics of the bath used for each specimen are indicated in the table below.

Rinsing with water.

Drying to eliminate the water adsorbed during the rinsing step.

Insertion of the strip into a vacuum chamber which is at a pressure $P<10^{-3}$ mbar.

Preheating of the strip to a temperature of approximately 120° C.

Depositing of a layer of stainless steel 316L by magnetron cathodic pulverization (see description of this method above). The thickness of this layer of stainless steel 316L varies from one specimen to another and is indicated in the table below.

Deposition of a layer of zinc by JVD (See description of this process above).

The characteristics of each specimen are listed in the table below:

| No. | Steel | Sheet thickness (mm) | Type of oxides | Degreasing | Thickness of stainless steel (nm) | Thickness of Zn (μm) |
|---|---|---|---|---|---|---|
| 10 | DP1180 | 1.22 mm | Chromium oxides and iron oxides | Novaclean ™ 300M 2% + Ridosol ® 0.2% 60° C.-10 sec pH = 12 | 2.5 nm | 8 μm |
| 11 | | | | | 5 nm | |
| 12 | | | | | 10 nm | |
| 13 | MS1500 | 1.1 mm | Iron oxides | | 2.5 nm | 8 μm |
| 14 | | | | | 5 nm | |
| 15 | | | | | 10 nm | |
| 16 | Trip Dual 1200 | 0.8 m | Mixed Mn—Si oxides | | 2.5 nm | 8 μm |
| 17 | | | | | 5 nm | |
| 18 | | | | | 10 nm | |
| 19 | Usibor ® AS150 | 1.5 mm | Mixed Al—Si oxides | S5183 60° C.-15 sec pH = 14 | 3 nm | 4.5 μm |
| 20 | | | | | 15 nm | |

Novaclean™ and Ridosol® are products sold by Henkel. Gardoclean S5183 is sold by Chemetall.

Specimens 10 to 12 were prepared starting with DP1180 steel sheets as sold by ArcelorMittal. The exact composition of the steel used for the specimens was 0.15% C, 1.9% Mn, 0.2% Si, 0.2% Cr, and 0.013% Ti. The percentages are percentages by weight, the remainder being iron and potential impurities resulting from fabrication. The majority of the metal oxides present on the surface of the steel sheet are chromium oxides and iron oxides. The oxidized steel sheet was coated with a layer of stainless steel 316L, the thickness of which varied from one specimen to another, and then a layer of zinc with a thickness between 7.5 and 8 μm.

The specimens 13 to 15 were prepared starting with MS1500 steel sheets as sold by ArcelorMittal. MS stands for martensitic steel. The exact composition of the steel used for the specimens is 0.225% C, 1.75% Mn, 0.25% Si, 0.2% Cr, 0.035% Ti. The percentages are percentages by weight, the remainder being iron and potential impurities resulting from fabrication. The majority of the metal oxides present on the surface of the steel sheet are iron oxides. The oxidized steel sheet was coated with a layer of stainless steel 316L, the thickness of which varied from one specimen to another, and then a layer of zinc with a thickness between 7.5 and 8 μm. Specimens 16 to 18 were prepared starting with Trip Dual 1200 steel sheets as sold by ArcelorMittal. The exact composition of the steel used for the specimens is 0.2% C, 2.2% Mn, 1.5% Si, and 0.2% Cr. The percentages are percentages by weight, the remainder being iron and potential impurities resulting from fabrication. The majority of the metal oxides present on the surface of the steel sheet are mixed manganese and silicon oxides. The oxidized steel sheet was coated with a layer of 316L stainless steel, the thickness of which varied from one specimen to another, followed by a layer of zinc with a thickness between 7.5 and 8 μm.

Specimens 19 and 20 were prepared starting with Usibor® AS150 steel sheets. The steel in question is a Usibor® steel coated with a layer of 150 g/m$^2$ of AluSi®, an aluminum- and silicon-based coating. The exact composition of the AluSi® coating used for these specimens was 90% Al, 10% Si. The percentages are expressed by weight. The majority of the metal oxides present on the surface of the steel sheet are mixed aluminum and silicon oxides. The oxidized steel sheet was covered with a layer of stainless steel 316L, the thickness of which varied from one specimen to another, followed by a layer of zinc in a thickness between 4 and 5 μm.

This set of specimens was then subjected to the T-bend and Daimler Bending tests as described above.

The results are presented in the table below:

| | | Daimler Bending | |
|---|---|---|---|
| No. | T-Bend | Angle | Result |
| 10 | OK | 108° | OK |
| 11 | OK | 108° | OK |
| 12 | OK | 108° | OK |
| 13 | OK | 137° | OK |
| 14 | OK | 137° | OK |
| 15 | OK | 137° | OK |
| 16 | OK | 89° | OK |
| 17 | OK | 89° | OK |
| 18 | OK | 89° | OK |
| 19 | OK | Not tested | |
| 20 | OK | Not tested | |

These results prove that with the substrate in accordance with a preferred embodiment of the present invention, the zinc coating is adherent regardless of the composition of the metal oxides present on the surface or of the pH of the solution used for degreasing. In addition, the results of the adhesion tests of the zinc coating are positive beginning with the application of a thickness of 2.5 nm of stainless steel 316.

Test-3

A series of 2 specimens was prepared starting with Usibor® steel. The 2 specimens were subjected to the following process steps:

Alkaline degreasing to remove any potential organic residue that may be present on the surface of the steel sheet. This degreasing is performed by dipping the strip in a bath of a basic solution held at 60° C. The dip time as well as the characteristics of the bath used for each specimen are indicated in the table below.

Rinsing with water.

Drying to remove the water adsorbed during the rinsing step.

Insertion of the strip into a vacuum chamber which is at a pressure of $P<10^{-3}$ mbar.

Deposition of a metal coating.

Specimen 31 as described by the prior art is subjected after the drying step to an etching step to remove the metal oxides present on the surface of the steel sheet. Specimen 32 as claimed by the invention is then subjected after the step of the insertion into a vacuum chamber to a step in which it is coated with a layer of stainless steel 316L by magnetron cathodic pulverization (see description of this process above).

The thickness of this coating is 10 nm.

Following the etching step or following the step of the deposition of a layer of stainless steel 316L, the specimens were coated with a layer of 5 µm of aluminum by magnetron cathodic pulverization.

The characteristics of each specimen are presented in the table below:

| Number | Steel sheet | Etching | Coating stainless steel 316 | Metal coating |
|--------|-------------|---------|------------------------------|---------------|
| 31     | Usibor ®    | Yes     | No                           | 5 µm Al       |
| 32*    | Usibor ®    | No      | 10 nm                        | 5 µm Al       |

*Specimen as claimed by the invention.

The adhesion of the top metal coating of each specimen was then tested by means of an adhesive tape applied to the flat specimen and then removed. The adhesive tape used has an adhesive strength between 400 and 460 N/m, e.g. Scotch® 3M595. The result is positive if the coating remains on the surface of the specimen and does not appear on the adhesive tape when the tape is removed. For all of the specimens tested, the adhesive tape did not contain any coating after the test, which means that the coating is adherent. This result was expected for specimen 31 of the prior art because it had been subjected to an etching step which removed the metal oxides that were present on the surface of the steel sheet, whether or not it was coated. On the other hand, these results show that this step of removing the oxides can be eliminated by the deposition of a layer of stainless steel 316L directly on the oxidized surface, because the results of the adhesion test are also positive with the configuration of a preferred embodiment of the present invention.

What is claimed is:

1. A substrate provided with a plurality of layers comprising:
   an oxide layer including metal oxides;
   a metal coating layer topping and in direct contact with the oxide layer, the metal coating layer including:
      at least 8% by weight nickel;
      at least 10% by weight chromium; and
      a remainder being iron, additional elements and impurities, the impurities resulting from a fabrication process;
   an anti-corrosion coating layer topping and in direct contact with the metal coating layer; and
   a steel sheet located under the oxide layer.

2. The substrate provided with a plurality of layers as recited in claim 1, wherein the metal coating layer includes stainless steel comprising from 10 to 13% by weight nickel, from 16 to 18% by weight chromium, and the remainder being iron and impurities resulting from the fabrication process.

3. The substrate provided with a plurality of layers as recited in claim 1, wherein the metal coating layer includes, at least one layer of stainless steel containing about 0.02% by weight carbon, from 16 to 18% by weight chromium, from 10.5 to 13% by weight nickel, from 2 to 2.5% by weight molybdenum, from 0.9 to 1.3% by weight silicon, from 1.8 to 2.2% by weight manganese, the remainder being iron and impurities resulting from the fabrication process.

4. The substrate provided with a plurality of layers as recited in claim 1, wherein the metal coating layer has a thickness between 2 and 15 nm.

5. The substrate provided with a plurality of layers as recited in claim 1, wherein the anti-corrosion coating layer includes a metal selected from the group consisting of zinc, aluminum, copper, magnesium, titanium, nickel, chromium, manganese and their alloys.

6. The substrate provided with a plurality of layers as recited in claim 5, wherein the anti-corrosion coating layer includes zinc or a zinc alloy.

7. The substrate provided with a plurality of layers as recited in claim 1, wherein the anti-corrosion coating layer includes a plurality of sub-layers of metal coatings.

8. The substrate provided with a plurality of layers as recited in claim 1, further comprising a further anti-corrosion layer that is located under the oxide layer and in direct contact with the oxide layer.

9. The substrate provided with a plurality of layers as recited in claim 1, wherein the steel sheet has a strength greater than or equal to 450 MPa.

10. The substrate provided with a plurality of layers as recited in claim 1, wherein the steel sheet is in direct contact with the oxide layer.

11. A substrate provided with a plurality of layers comprising:
    a metal sheet,
    at least one surface of the metal sheet having an oxide layer, the oxide layer being topped by and in direct contact with a first metal coating layer, the first metal coating layer including:
       at least 8% by weight nickel;
       at least 10% by weight chromium; and
       a remainder being iron, additional elements and impurities, the impurities resulting from a first fabrication process,
    the first metal coating layer being topped by and in direct contact with a first anti-corrosion coating layer; and
    a second oxide layer including metal oxides, the second oxide layer topping and in direct contact with the first anti-corrosion coating layer;
    a second metal coating layer topping and in direct contact with the second oxide layer, the second metal coating layer including:
       at least 8% by weight nickel;
       at least 10% by weight chromium, and
       a remainder being iron, additional elements and impurities, the impurities resulting from a second fabrication process; and
    a second anti-corrosion coating layer topping and in contact with the second metal coating layer.

12. The substrate provided with a plurality of layers as recited in claim 11, wherein the first anti-corrosion coating layer includes a metal selected from the group consisting of zinc, aluminum, copper, magnesium, titanium, nickel, chromium, manganese, and alloys of aluminum, copper, magnesium, titanium, nickel, chromium, and manganese.

13. A substrate provided with a plurality of layers comprising:
    a steel sheet,
    at least one surface of the steel sheet having an oxide layer, the oxide layer being topped by and in direct contact with a first metal coating layer, the first metal coating layer including:
       at least 8% by weight nickel;
       at least 10% by weight chromium; and
       a remainder being iron, additional elements and impurities, the impurities resulting from a first fabrication process, the first metal coating layer being topped by and in direct contact with a first anti- corrosion coating layer; and a second oxide layer including metal oxides topping and in direct contact with the first anti-corrosion coating layer;

a second metal coating layer topping and in direct contact with the second oxide layer, the second metal coating layer including:
- at least 8% by weight nickel;
- at least 10% by weight chromium, and
- a remainder being iron, additional elements and impurities, the impurities resulting from a second fabrication process; and a second anti-corrosion coating layer over and in contact with the second metal coating layer.

14. The substrate provided with a plurality of layers as recited in claim 13, wherein the first anti-corrosion coating layer includes a metal selected from the group consisting of zinc, aluminum, copper, magnesium, titanium, nickel, chromium, manganese and their alloys.

15. The substrate provided with a plurality of layers as recited in claim 13, wherein the steel sheet is in direct contact with the oxide layer.

* * * * *